United States Patent
Yang et al.

(10) Patent No.: US 6,451,647 B1
(45) Date of Patent: Sep. 17, 2002

(54) INTEGRATED PLASMA ETCH OF GATE AND GATE DIELECTRIC AND LOW POWER PLASMA POST GATE ETCH REMOVAL OF HIGH-K RESIDUAL

(75) Inventors: Chih-Yuh Yang, San Jose; Minh Van Ngo, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/100,819

(22) Filed: Mar. 18, 2002

(51) Int. Cl.[7] ............... H01L 21/8242; H01L 21/20; H01L 21/302; H01L 21/31; H01L 21/108
(52) U.S. Cl. ............. 438/240; 438/396; 438/689; 438/694; 438/761; 438/785; 257/310; 257/410
(58) Field of Search .................. 438/240, 396, 438/287, 761, 763, 785, 197, 789–790, 689, 694; 257/310, 410, 411

(56) References Cited

U.S. PATENT DOCUMENTS

| | | | |
|---|---|---|---|
| 5,924,000 A | 7/1999 | Linliu | 438/592 |
| 6,013,570 A | 1/2000 | Yu et al. | 438/595 |
| 6,020,243 A * | 2/2000 | Wallace et al. | 438/287 |
| 6,074,956 A | 6/2000 | Yang et al. | 438/721 |
| 6,159,794 A | 12/2000 | Yang et al. | 438/257 |
| 6,283,131 B1 | 9/2001 | Chen et al. | 134/1.2 |
| 6,290,806 B1 | 9/2001 | Donohoe | 156/345 |
| 6,291,356 B1 | 9/2001 | Ionov et al. | 438/710 |
| 6,291,361 B1 | 9/2001 | Hsia et al. | 438/738 |
| 6,300,203 B1 * | 10/2001 | Buynoski et al. | 438/287 |
| 6,322,714 B1 | 11/2001 | Nallan et al. | 216/67 |
| 6,342,165 B1 | 1/2002 | Donohoe et al. | 216/67 |
| 6,348,373 B1 * | 2/2002 | Ma et al. | 438/240 |
| 2002/0048910 A1 * | 4/2002 | Taylor et al. | 438/486 |

FOREIGN PATENT DOCUMENTS

DE 4032566 * 4/1992

* cited by examiner

Primary Examiner—Olik Chaudhuri
Assistant Examiner—Shrinivas H. Rao
(74) Attorney, Agent, or Firm—Renner, Otto, Boisselle & Sklar, LLP

(57) ABSTRACT

The present invention relates to a process of fabricating a semiconductor device, including steps of providing a first semiconductor wafer; depositing on the first semiconductor wafer a layer comprising a high-K dielectric material layer; depositing on the layer comprising a high-K dielectric material a polysilicon or polysilicon-germanium layer; and forming a gate stack by plasma etching both a portion of the polysilicon or polysilicon-germanium layer and a portion of the layer comprising a high-K dielectric material in a single chamber. In one embodiment, the step of plasma etching is carried out without moving the first wafer from the chamber. In another embodiment an unwanted residual high-K dielectric material is removed by applying a low power plasma treatment.

18 Claims, 3 Drawing Sheets

US 6,451,647 B1

INTEGRATED PLASMA ETCH OF GATE AND GATE DIELECTRIC AND LOW POWER PLASMA POST GATE ETCH REMOVAL OF HIGH-K RESIDUAL

TECHNICAL FIELD

The invention relates generally to the fabrication of semiconductor devices and, more particularly, to the formation of a gate stack by an integrated plasma etch of gate and gate dielectric layers. The invention further relates to integration of high-K dielectric materials into existing semiconductor fabrication processes.

BACKGROUND ART

Fabrication of a semiconductor device and an integrated circuit thereof begins with a semiconductor wafer and employs various processes, such as film formation, ion implantation, photolithography, etching and deposition techniques to form various structural features in or on a semiconductor wafer to attain individual circuit components which are then interconnected to ultimately form an integrated semiconductor circuit. Escalating requirements for high densification and performance associated with ultra large-scale integration (ULSI) semiconductor devices requires smaller design features, increased transistor and circuit speeds, high reliability and increased manufacturing throughput for competitiveness. As the devices and features shrink, and as the drive for higher performing devices escalates, new problems are discovered that require new methods of fabrication or new arrangements or both.

There is a demand for large-scale and ultra large-scale integration devices employing high performance metal-oxide-semiconductor (MOS) devices. MOS devices typically comprise a pair of ion implanted source/drain regions in a semiconductor substrate and a channel region separating the source/drain regions. Above the channel region is typically a thin gate dielectric material, usually referred to as a gate oxide, and a conductive gate comprising conductive polysilicon or another conductive material. In a typical integrated circuit, a plurality of MOS devices of different conductivity types, such as n-type and p-type, and complementary MOS (CMOS) devices employing both p-channel and n-channel devices are formed on a common substrate. MOS technology offers advantages of significantly reduced power density and dissipation as well as increased reliability, circuit performance and cost advantages.

The drive towards increased miniaturization and the resultant limits of conventional gate oxide layers have served as an impetus for the development of newer, high dielectric constant ("high-K") materials as substitutes for conventional silicon dioxide-based gate oxide layers. Since the drain current in a MOS device is inversely proportional to the gate oxide thickness, the gate oxide is typically made as thin as possible commensurate with the material's breakdown potential and reliability.

Decreasing the thickness of the gate oxide layer between the gate electrode and the source/drain extension regions together with the relatively high electric field across the gate oxide layer, can undesirably cause charge carriers to tunnel across the gate oxide layer. This renders the transistor "leaky", degrading its performance. To alleviate this problem, high-K dielectric materials are used as the gate dielectric. Herein, a high-K gate oxide may be referred to as a high-K gate dielectric material layer, in order to emphasize that the gate dielectric comprises a high-K dielectric material rather than silicon dioxide, which is often referred to simply as "oxide".

When integrating new materials and/or processes into the fabrication of a semiconductor device, there is a strong need to do so with as little change as possible to existing facilities and equipment and to reduce the number of additional steps required by the new materials and processes. In addition, it is desirable to reduce the number of times a semiconductor wafer is handled or transferred during fabrication. As a result of new materials and/or processes, it is often necessary to address new problems presented by the new materials and/or processes which are to be integrated into existing processes, and it is sometimes possible to combine steps which would otherwise be discrete.

One problem with the addition of high-K dielectric materials to semiconductor devices arises during fabrication. In conventional devices, in which silicon dioxide is applied as a layer on a semiconductor wafer and a portion of the layer forms a gate dielectric, in most processes the portions of the layer not forming the gate dielectric can be allowed to remain on the other surfaces of the wafer. Unlike such silicon dioxide layers, when a layer of high-K dielectric material is applied as a layer and a portion of this layer is to be used as the gate dielectric, the remaining portions of the high-K dielectric material layer may be not wanted or may be deleterious, and so should be removed from the wafer. The removal of such high-K dielectric material has required a separate processing step in a separate apparatus from that used to form the gate structure. In addition, known etch chemistries for polysilicon and high-K dielectric materials are quite different, and require separate steps. It would be advantageous to simplify this process.

Another problem which has been encountered in integrating high-K dielectric materials into processes for fabrication of CMOS devices, is undesirable contamination of process apparatus and semiconductor devices resulting from the introduction of high-K dielectric materials into the fabrication process. Of particular concern in the present case is the possible contamination, from unwanted residual high-K dielectric material remaining after process steps such as polysilicon gate deposition and gate etching, to other semiconductor devices which do not contain high-K dielectric materials or which are sensitive or susceptible to such contamination. For example, during the gate etch steps, sub-microscopic or larger particles of unwanted residual high-K dielectric material may become deposited or may inadvertently remain on the semiconductor wafer. When the high-K containing semiconductor wafer is subsequently processed in an apparatus which also is used in processing a non-high-K-containing semiconductor wafer, the latter wafer may become contaminated with the high-K dielectric material, which may be present as an unwanted residual on the high-K containing wafers. For example, the apparatus may become contaminated with high-K dielectric material from the high-K containing wafer, resulting in contamination of wafers subsequently processed in the same apparatus.

Such undesirable interactions are not confined to CMOS devices. These interactions may also occur between polysilicon control gate and floating gate structures and adjacent high-K dielectric insulation or charge storage layers in SONOS-type devices such as the MIRRORBIT™ flash memory cell available from Advanced Micro Devices, Inc., Sunnyvale, Calif. These interactions may also occur, for example, in floating gate flash memory cells in devices such as EEPROMs and other flash memory devices.

Hence, it would be highly advantageous to develop a process that would permit the integration of high-K materials into existing fabrication apparatus and processes, in which the high-K material could be processed together with high-K-sensitive elements while minimizing contamination of the high-K-sensitive elements with high-K material. It is also advantageous to optimize methodologies of MOS fabrication. Accordingly, there exists a need for a process of fabricating semiconductor devices with a high-K dielectric material layer which reduces the number of process steps and, improves device performance, while avoiding undesirable interactions between unwanted residual high-K dielectric materials remaining on semiconductor wafers containing such high-K dielectric materials and semiconductor wafers which do not include high-K dielectric materials.

DISCLOSURE OF INVENTION

In one embodiment, the present invention relates to a process of fabricating a semiconductor device, including steps of providing a first semiconductor wafer; depositing on the first semiconductor wafer a layer comprising a high-K dielectric material layer; depositing on the layer comprising a high-K dielectric material a polysilicon or polysilicon-germanium layer; and forming a gate stack by plasma etching both a portion of the polysilicon or polysilicon-germanium layer and a portion of the layer comprising a high-K dielectric material, in which the steps of plasma etching are carried out in a single chamber without moving the first wafer from the chamber.

In another embodiment, the present invention relates to a process of integrating a high-K dielectric material into a fabrication process for processing both a high-K-containing semiconductor wafer and a non-high-K-containing semiconductor wafer, including steps of depositing on a semiconductor wafer a layer comprising a high-K dielectric material to form a high-K-containing semiconductor wafer; depositing on the layer comprising a high-K dielectric material a polysilicon or polysilicon-germanium layer; plasma etching both a portion of the polysilicon or polysilicon-germanium layer and a portion of the high-K dielectric material layer in a single chamber without moving the first wafer from the chamber and without opening the chamber to form a gate stack comprising a gate and a gate dielectric; and applying a low power plasma treatment to the wafer and to the chamber prior to transferring the wafer to a subsequent apparatus in which a non-high-K-containing semiconductor wafer also is processed.

In another embodiment, the present invention relates to a process of fabricating a semiconductor device, including steps of providing a first semiconductor wafer; depositing on the first wafer a layer comprising a high-K dielectric material layer; depositing on the layer comprising a high-K dielectric material a polysilicon or polysilicon-germanium layer; plasma etching both a portion of the polysilicon or polysilicon-germanium layer and a portion of the layer comprising a high-K dielectric material to form a gate stack comprising a gate and a gate dielectric, wherein the steps of plasma etching are carried out in a single chamber without moving the first wafer from the chamber and without opening the chamber, and the step of plasma etching the high-K dielectric material comprises providing oxygen, a fluorine-containing material and an inert gas to the chamber; and removing from the first wafer any unwanted residual high-K dielectric material present on the first wafer by applying a low power plasma treatment in the chamber. In one embodiment, when the first wafer is transferred to a subsequent apparatus which is used for processing both the first wafer and a second semiconductor wafer susceptible to contamination by a residual high-K dielectric material, the subsequent apparatus remains substantially free of contamination by the high-K dielectric material.

Thus, the present invention provides a plasma etch for both the gate and the underlying high-K gate dielectric, forming a gate stack in a single chamber without moving the wafer during processing, thus simplifying and reducing the number of steps in the fabrication process by avoiding the need for moving the wafer during these steps. In addition, the present invention provides a solution to the problem of removing unwanted residual material in a process of fabricating semiconductor devices with a high-K dielectric material layer. The present invention thus provides a process that fabricates a device having improved performance, while both minimizing processing steps and avoiding undesirable interactions between unwanted residual high-K dielectric materials remaining on semiconductor wafers containing such high-K dielectric materials and semiconductor wafers which do not include high-K dielectric materials.

Figure 1:
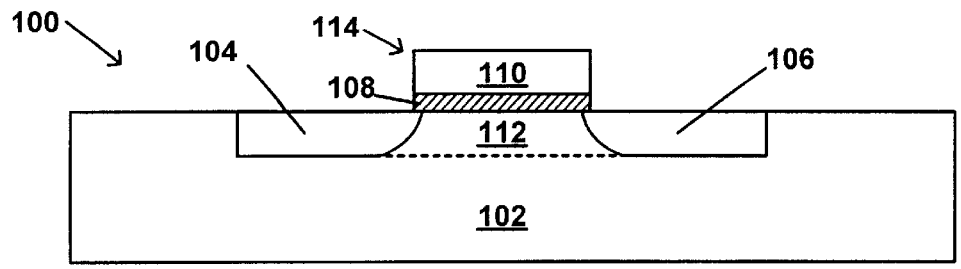
FIG. 1 is a schematic cross-sectional view of an exemplary MOS structure in accordance with the present invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

MODES FOR CARRYING OUT THE INVENTION

As used herein, the term "standard-K dielectric material" refers to a dielectric material having a dielectric constant, K, up to about 10. Such standard-K dielectric materials include, for example, silicon dioxide, having a K of about 4, silicon oxynitride, having a K of about 4–8 depending on the relative content of oxygen and nitrogen, and silicon nitride, having a K of about 6–9, and aluminum oxide, having a K of about 10.

As used herein, the term "high-K dielectric material" refers to a dielectric material having a dielectric constant, K, greater than about 10. Such high-K dielectric materials include, for example, $HfO_2$, $ZrO_2$ and others known in the art, some of which are specifically identified more fully below. In general, the term "high-K dielectric material" encompasses binary, ternary and higher oxides and any ferroelectric material having a K of about 10 or more. High-K dielectric materials may also include, for example, composite materials such as hafnium silicate, having a K of about 14, and hafnium silicon oxynitride, having a K of about 16, depending on the relative content of oxygen and nitrogen, and hafnium silicon nitride, having a K of about 18.

As used herein, the term "composite dielectric material" refers to a dielectric material comprising the elements of at least two other dielectric materials. A composite dielectric material generally has a K value as defined above for a high-K dielectric material. As described in more detail below, a composite dielectric material may be formed by co-deposition of its component elements, or by sequential deposition followed by a treatment step, e.g., thermal treatment, to combine the elements to form the composite dielectric material.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

Using a high-K dielectric material for the gate dielectric layer provides a layer having a low electrical thickness in a physically thick layer. For example, a high-K gate dielectric with a K of 40 and a thickness of 100 angstroms is substantially electrically equivalent to a silicon dioxide gate dielectric (K about 4) having a thickness of about 10 angstroms. The electrically equivalent thickness of high-K materials may be referred to in terms of the equivalent oxide thickness of a layer of silicon dioxide. Thus, a high-K dielectric material layer having a K value of 40 and a given physical thickness has an equivalent oxide thickness which is approximately 1/10 the given physical thickness. For higher-K dielectric materials, even thicker gate dielectric material layers can be formed while maintaining equivalent oxide thickness values lower than are practically possible with very thin silicon dioxide layers. In this way, the reliability problems associated with very thin dielectric layers may be avoided while transistor performance is increased.

Approximate K-values or, in some cases, a range of K-values, are shown below in Table 1 for some exemplary dielectric materials. It is understood that the present invention is not limited to the specific dielectric materials disclosed herein, but may include any appropriate standard-K, high-K and composite dielectric materials which are known and are compatible with the remaining elements of the semiconductor device with which the dielectric materials are to be used.

TABLE 1

| Dielectric Material | Approximate Dielectric Constant (K) (Relative Permittivity) |
|---|---|
| silicon dioxide | 4 |
| silicon nitride | 6–9 |
| silicon oxynitride | 4–8 |
| aluminum oxide | 10 |
| zirconium silicate | 12 |
| hafnium silicate | 15 |
| hafnium aluminate | 12–20 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20–~200 |
| $PbTiO_3$ | ~20–~200 |
| $BaTiO_3$ | ~20–~200 |
| $SrTiO_3$ | ~20–~200 |
| $PbZrO_3$ | ~20–~200 |
| PST ($PbSc_xTa_{1-x}O_3$) | ~20–~3000 |
| PZN ($PbZn_xNb_{1-x}O_3$) | ~200–~5000 |
| PZT ($PbZr_xTi_{1-x}O_3$) | ~100–~1000 |
| PMN ($PbMg_xNb_{1-x}O_3$) | ~200–~5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, hafnium oxide, when stoichiometrically exact, has the chemical formula $HfO_2$. As used herein, the term "hafnium oxide" may include variants of stoichiometric $HfO_2$, which may be referred to as $Hf_xO_y$ in which either of x or y vary by a small amount. For example, in one embodiment, x may vary from about 0.75 to about 1.5, and y may vary from about 1.5 to about 3. In another embodiment, x may vary from about 0.9 to about 1.2, and y may vary from about 1.8 to about 2.2. Such variations from the exact stoichiometric formula fall within the definition of hafnium oxide. Similar variations from exact stoichiometry are included when the chemical formula for a compound is used. For example, again using hafnium oxide as an example, when the formula $HfO_2$ is used, $Hf_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

Semiconductor Devices

The present invention is described hereinbelow in terms of a common semiconductor device, specifically, a metal oxide semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a highK dielectric material may be used, for example, a high-K gate dielectric in a FET, in a floating metal gate electrode EEPROM flash memory device, in a SONOS-type flash memory device, such as the Mirror-Bit™ SONOS-type flash memory device available from Advanced Micro Devices, Sunnyvale, California. The invention is applicable to any device comprising a high-K dielectric material in which the device is to be integrated into a fabrication process which is also used for semiconductor wafers which do not include a high-K dielectric material, and to semiconductor wafers which may be sensitive to contamination by a high-K dielectric material, or for any other reason in which residual high-K dielectric material needs to be removed. Thus, it is to be understood that the present invention is not limited to the specific illustrative embodiments described below.

In one embodiment, the present invention relates to a process of making the semiconductor device, in which the semiconductor device may include, for example, a semiconductor substrate, a polysilicon or polysilicon-germanium gate electrode and a high-K gate dielectric material layer separating the polysilicon or polysilicon-germanium gate electrode from the semiconductor device surface.

FIG. 1 is a schematic cross-sectional view of a MOSFET 100. The MOSFET 100 includes, for example, a p-doped silicon substrate 102, an n-doped source region 104, an n-doped drain region 106, a high-K gate dielectric material layer 108, a gate electrode 110, and a channel region 112. The high-K gate dielectric 108 and the gate 110 form a gate stack 114.

Not shown in FIG. 1 are additional parts of a working semiconductor device, such as electrical conductors, interlayer dielectric layer, contacts and other parts of the structure which would be included in a complete, working semiconductor device. These additional parts are not necessary to the present invention, and for simplicity and brevity are neither shown nor described, but could be easily added as will be understood by those of skill in the art.

In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

The present invention is described, in some embodiments, in terms of a polysilicon or polysilicon-germanium gate electrode layer deposited over a high-K gate dielectric material layer, and subsequent etching of these layers to form a gate stack including a gate electrode and a gate dielectric. The invention is not limited to such embodiments, but may be applied to etching of layers of other materials together with a high-K dielectric material layer. In addition, the removal of unwanted residual high-K material by a low power plasma following etching of the high-K dielectric material layer while still in the etch chamber is applicable to any semiconductor device in which a high-K dielectric material is used, and in which the high-K dielectric material may possibly contaminate an apparatus which is used subsequently for processing any other semiconductor wafer or device which is subject to such contamination.

Processes for Fabricating a Semiconductor Device

The present invention further relates to a process of fabricating a semiconductor device including a high-K dielectric material, and to a process for integrating a high-K containing semiconductor wafer or device into a process which may also be used for non-high-K containing semiconductor wafers.

Details of an exemplary process in accordance with the present invention are set forth below. The specific examples provided herein are intended to explain the invention, but are not intended to limit the scope of the invention, which is defined by the attached claims.

Figure 2:
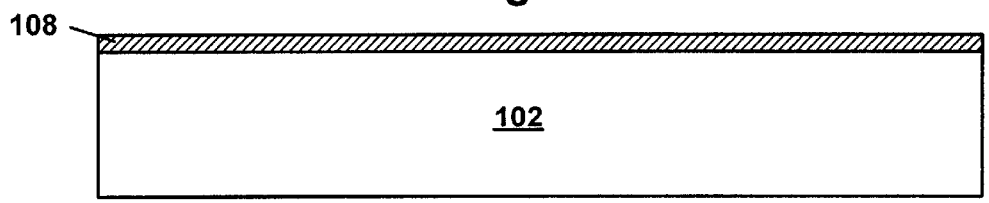
FIG. 2 is a schematic cross-sectional view of a semiconductor wafer with a high-K gate dielectric material layer applied thereon.
Figure 10:
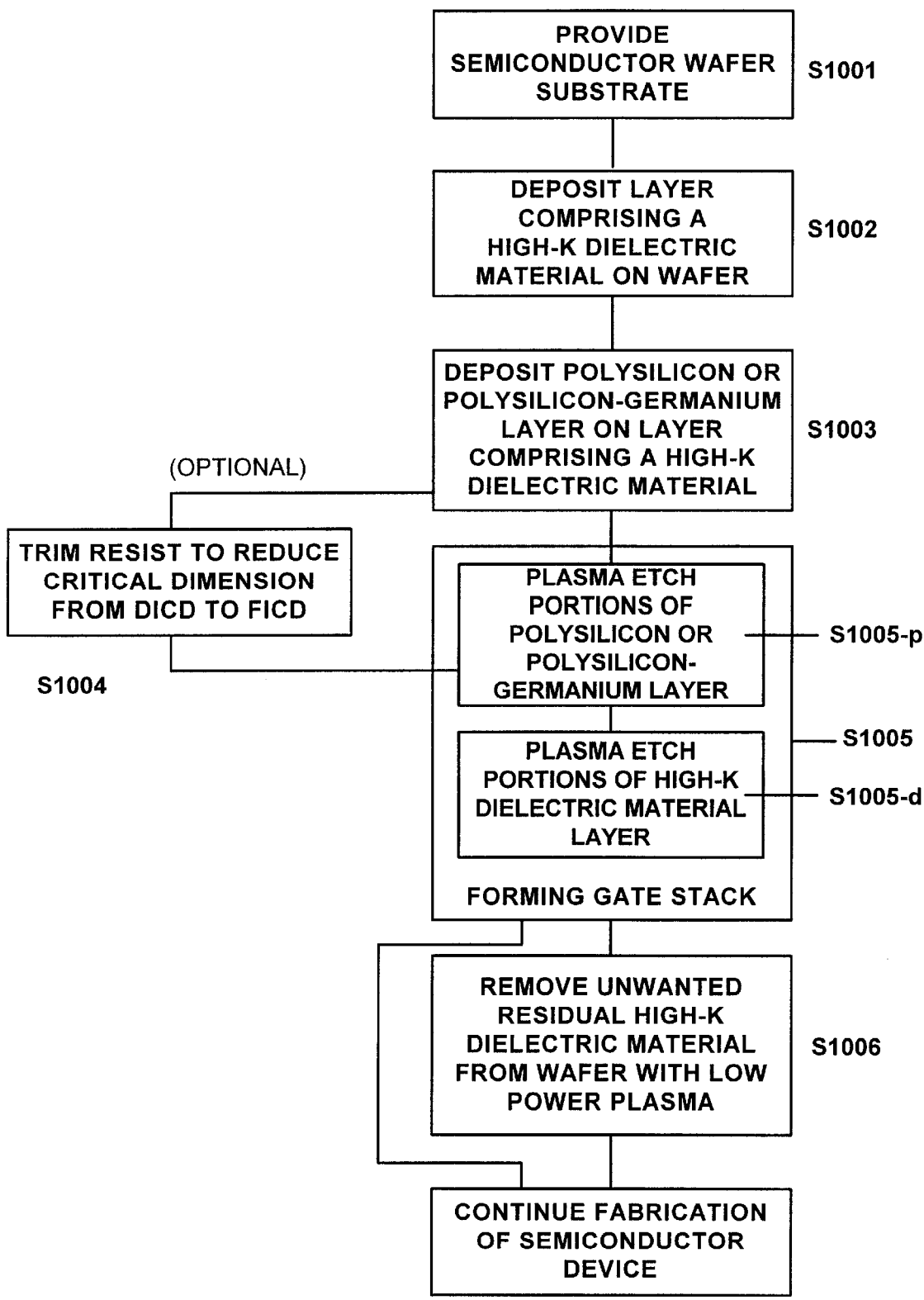
FIG. 10 is a schematic flow diagram showing steps in a process of fabricating a semiconductor device, in accordance with the present invention.

In the first step of the process of the present invention, shown in FIG. 10 as Step S1001, a semiconductor wafer 102 is provided, as shown in, e.g., FIG. 2. The semiconductor wafer 102 may be any appropriately selected semiconductor substrate known in the art, as described above.

In the second step of the process of the present invention, shown in FIG. 10 as Step S1002, a high-K gate dielectric material layer 108 is deposited on the surface of the semiconductor wafer 102. FIG. 2 shows the nascent semiconductor device 100 after deposition of a high-K gate dielectric material layer 108, i.e., at the completion of step S1002.

The high-K dielectric material layer 108 may be deposited by any appropriate method known in the art. In one embodiment, the high-K dielectric material layer 108 is deposited by a suitable CVD process. For example, the high-K dielectric material may be deposited by LPCVD, RTCVD, MOCVD or ALCVD. In addition, the high-K dielectric material may be deposited by PVD or sputtering.

The high-K gate dielectric material layer 108 may include any high-K material which is appropriate for use with the particular semiconductor device of interest in the fabrication process. The gate dielectric layer 108 may comprise, for example, any one of a variety of known high-K dielectric materials, such as those listed above or those described in detail in the following. Such materials may include, for example, hafnium oxide, yttrium oxide, lanthanum oxide, and combinations of such high-K dielectric materials with standard-K dielectric materials (e.g., $SiO_2$), such as hafnium silicate, $HfSiO_4$. Suitable exemplary high-K dielectric materials include those disclosed in the above table and associated disclosure.

In one embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In another embodiment, the high-K dielectric material includes at least one of silicates of one or more of $ZrO_2$, $HfO_2$, $Al_2O_3$, $Y_2O_3$, $CeO_2$ and $La_2O_3$ or aluminates of one or more of $ZrO_2$, $HfO_2$, $Y_2O_3$, $CeO_2$ and $La_2O_3$. Combinations of the foregoing high-K and composite dielectric materials may also be used. In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 10 or higher, also may be used in the present invention.

In one embodiment, the high-K material is a high-K material other than tantalum oxide ($Ta_2O_5$). Tantalum oxide has been found, in some embodiments, to exhibit an undesirably high leakage current.

In one embodiment, the high-K dielectric material has a K value in the range from about 10 to about 5000. In another embodiment, the high-K dielectric material has a K value in the range from about 10 to about 200, and in yet another embodiment, the K value is from about 15 to about 50.

Although only a single high-K gate dielectric material layer 108 is shown in FIG. 2, it is understood that multiple layers may be included in the layer 108.

Figure 3:
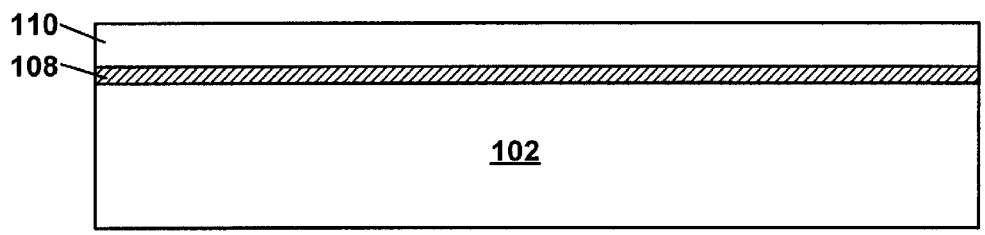
FIG. 3 is a schematic cross-sectional view of a semiconductor wafer with a polysilicon or polysilicon-germanium gate layer deposited on the high-K dielectric material layer of FIG. 2.

In the third step of the process of the present invention, shown in FIG. 10 as Step S1003, a polysilicon or polysilicon-germanium gate layer 110 is deposited on the high-K dielectric material layer 108. FIG. 3 shows the nascent semiconductor device 100 after application of a polysilicon or polysilicon-germanium gate layer 110 on the high-K gate dielectric material layer 108, i.e., at the completion of step S1003.

The polysilicon or polysilicon-germanium gate layer 110 is deposited by applying a layer 110 of polysilicon or polysilicon-germanium by any suitable method known in the art over the surface of the high-K dielectric material layer 108.

In one embodiment the step of depositing a polysilicon or polysilicon-germanium layer is carried out by CVD. In one such embodiment, the CVD process may be LPCVD, RTCVD, MOCVD or ALCVD. In one embodiment, the step of depositing a polysilicon or polysilicon-germanium layer is carried out by a non-plasma CVD process. Nonplasma CVD processes may be preferred since these methods provide more control to the deposition process, and avoid deposition of impurities along with the polysilicon or polysilicon-germanium.

The CVD process may be carried out in suitable CVD apparatus, as known in the art. For example, the RTCVD, MOCVD or ALCVD processes may be carried out in a single-wafer cluster tool.

Plasma Etching to Form Gate Stack

Figure 8:
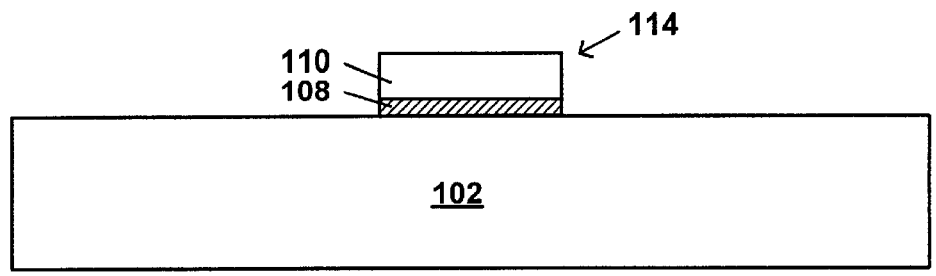
FIG. 8 is a schematic cross-sectional view of a semiconductor wafer following removal of portions of the polysilicon or polysilicon-germanium gate layer and of the gate dielectric layer to form a gate stack, in accordance with an embodiment of the present invention.

Following deposition of the polysilicon or polysilicon-germanium gate layer 110, as shown in Step S1005 of FIG. 10, the polysilicon or polysilicon-germanium gate layer 110 and the underlying high-K dielectric material layer 108 are plasma etched to form the gate stack 114, which includes the polysilicon or polysilicon-germanium gate electrode 110 and the high-K gate dielectric 108, as shown, e.g., in FIG. 8. The plasma etching of the polysilicon or polysilicon-germanium layer and of the high-K dielectric material layer is carried out by the method described below, in accordance with the present invention. As described in more detail below, in one embodiment, the step of plasma etching may be preceded by an optional step of resist trim, shown in FIG. 10 as step S1004.

The plasma etching step may be preceded by formation of one or more suitable resist layer and bottom anti-reflective coating (BARC), as known in the art. The resist material may be, for example, 248 nm DUV resist or 193 nm resist. The BARC may be, for example, silicon-rich silicon nitride, silicon oxynitride and other materials known in the art for use as a BARC.

In one embodiment, prior to etching the polysilicon or polysilicon-germanium gate electrode layer, the resist is trimmed, as shown in step S1004 of FIG. 10. As is known in the art, final critical dimensions, also referred to as "final image critical dimension" or FICD, may be less than the smallest critical dimensions which can be obtained by photolithography, which may be referred to as develop image critical dimension, or DICD. In one embodiment, this problem is overcome by subjecting the photolithographically patterned photoresist to a resist trim, in which the critical dimensions of the resist are reduced from DICD to FICD. The resist trim is described below in more detail.

Figure 4:
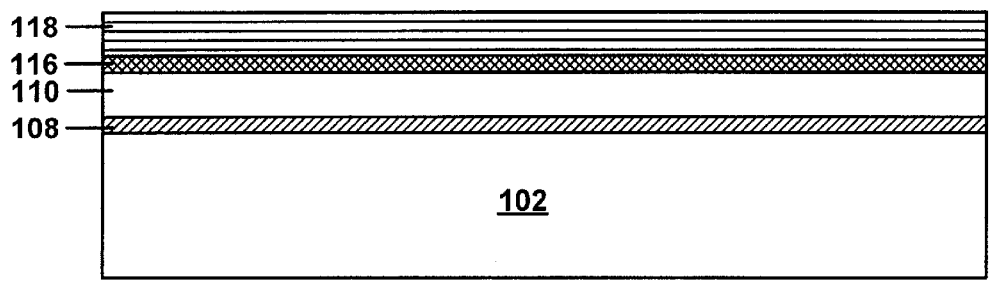
FIG. 4 is a schematic cross-sectional view of a semiconductor wafer with BARC and a photoresist layers formed on the polysilicon or polysilicon-germanium gate layer of FIG. 3.

As is known in the art, the gate etch may be preceded by formation of a BARC and a photoresist layer. FIG. 4 is a schematic cross-sectional view of a semiconductor wafer 102 with a BARC 116 and a photoresist layer 118 formed on the polysilicon or polysilicon-germanium gate layer 110 of FIG. 3.

Figure 5:
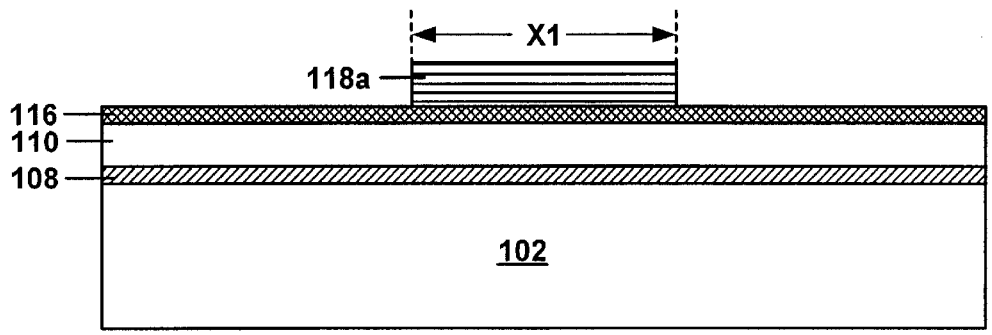
FIG. 5 is a schematic cross-sectional view of a semiconductor wafer in which the photoresist layer has been subjected to photolithography to form a desired pattern.

A desired pattern is then formed in the photoresist layer by a suitable lithography process. FIG. 5 is a schematic cross-sectional view of the semiconductor wafer in which the photoresist layer 118 has been subjected to lithography to form a desired pattern 118a. The pattern 118a has the DICD at this stage, indicated as X1 in FIG. 5.

As shown in FIG. 10, the resist trim step, indicated as step S1004, is an optional step. As an optional step, it is recognized that this step may be routinely carried out in order to obtain the desired FICD, but it is not essential to the present invention. The present invention is applicable to formation of a gate stack including a high-K dielectric material gate dielectric of any dimension.

In an embodiment in which the pattern 118a has a DICD, and a smaller FICD is needed, the pattern 118a may be subjected to a resist trim to reduce the DICD to the FICD. The resist trim may be carried out by any appropriate method known in the art.

Figure 6:
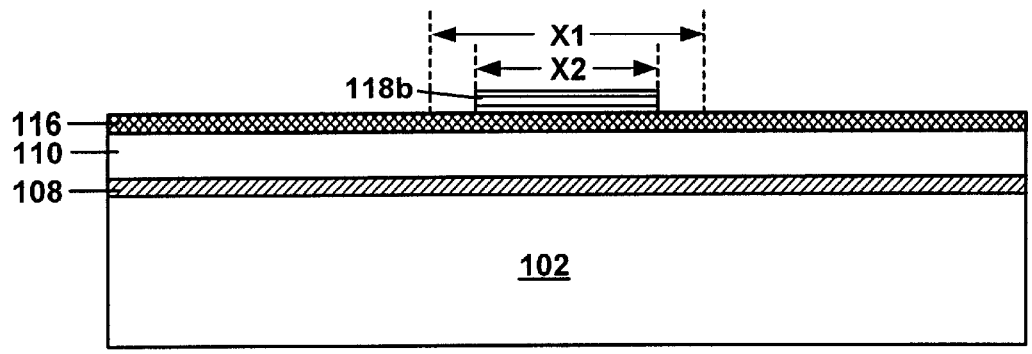
FIG. 6 is a schematic cross-sectional view of a semiconductor wafer in which the photoresist layer has been subjected to a resist trim to reduce the critical dimension of the desired pattern.

FIG. 6 is a schematic cross-sectional view of a semiconductor wafer 102 in which the desired pattern 118a of the photoresist layer 118 has been subjected to a resist trim to reduce the critical dimension of the desired pattern from the DICD shown in FIG. 5 to the FICD, shown as a reduced desired pattern 118b in FIG. 6. As shown in FIG. 6, the reduced desired pattern 118b has the FICD, indicated as X2. As shown in FIG. 6, the reduced desired pattern 118b is reduced in both width and height as compared to the desired pattern 118a shown in FIG. 5. Dashed lines in FIG. 6 indicate the both the dimension X1 and the dimension X2, for comparison. The remainder of the subsequent etches substantially maintain the dimension X2, in forming the gate stack 114. Following the resist trim, the process moves on to the plasma etching step.

As shown in FIG. 10, step S1005 includes a plasma etch to form the gate stack 114. In one embodiment, the plasma etching step S1005 comprises two steps carried out in sequence in the same plasma etching chamber. As shown in FIG. 10, and described in more detail below, in one embodiment, the step S1005 comprises two plasma etching steps, step S1005-p and step S1005-d. The first step, S1005-p, comprises plasma etching the polysilicon or polysilicon-germanium layer 110. The second step, S1005-d, comprises plasma etching the high-K dielectric material layer 108.

The steps S1005, plasma etching to form the gate stack 114, may be carried out by any plasma etching methods known in the art. In general, there are three types of plasma generation approaches: capacitive, inductive, and microwave. In the more conventional capacitive plasma approach, the plasma is formed between a pair of parallel plate electrodes, to which radio-frequency (RF) energy is applied, to one or both plates. A variant of the parallel plate approach is the magnetically enhanced reactive ion etch (MERIE) plasma generation apparatus, in which a magnetic field enhances the formation of ions in the plasma. Both the parallel plate configuration and the MERIE configuration typically use a single RF power generator. Inductive plasma generators use an inductive coil, either a planar coil, a cylindrical coil or any of various other types of coils to deliver RF power into the plasma chamber. A separate RF generator supplies energy to at least one plate electrode in the chamber, to control ion energy and direction. In one embodiment, the plasma etching of the present invention is carried out by MERIE. In another embodiment, the plasma etching of the present invention is carried out by high density plasma etching. In another embodiment, both methods may be used in sequence.

In one embodiment, following any gate trim etching, the step S1005-p, plasma etching the polysilicon or polysilicon-germanium, is carried out using conventional etching chemistry. In one embodiment, the step of plasma etching the polysilicon or polysilicon-germanium layer comprises a $HBr/Cl_2/HeO_2$ chemistry. In one embodiment, the step of plasma etching the polysilicon or polysilicon-germanium layer 110 is carried out at a pressure in the range from about 1 to about 100 mT, at a source RF power in the range from about 100 to about 1000 watts, at a bias RF power in the range from about 10 to about 100 watts, and at a cathode temperature in the range from about 40 to about 80° C. The gas flows include chlorine, $Cl_2$, in the range from about 10 to about 100 sccm, HBr in the range from about 10 to about 200 sccm, and a mixture of He and $O_2$ in the range from about 5 to about 25 sccm. In one embodiment, the step S1005-p further comprises providing a fluorine-containing material to the plasma chamber, in which the fluorine containing material is one of those described below with respect to step S1005-d. In another embodiment, the step S1005-p is carried out with no fluorine-containing material provided to the plasma chamber.

In another embodiment, the step S1005-p of plasma etching the polysilicon or polysilicon-germanium layer 110 is carried out using a MERIE system with power in the range from about 100 watts to 2000 watts; pressure from about 1 mT to about 100 mT; and a gas chemistry including HBr in the range from about 10 sccm to about 200 sccm; He in the range from about 2 sccm to about 20 sccm; $O_2$ in the range from about 2 sccm to about 20 sccm; $Cl_2$ in the range from about 10 sccm to about 100 sccm. These conditions are exemplary only, and are not intended to limit the range of applicable feeds. Any suitable conditions selected by those of skill in the art may be used for plasma etching the polysilicon or polysilicon-germanium layer 110. The foregoing mixture of HBr, $Cl_2$, $O_2$ and He etches selectively to oxide. In one embodiment, the etch of the polysilicon or polysilicon-germanium may include a main etch and an overetch or trim if desired. End point detection for the etch may be by optical emission spectroscopy (OES) or by interference end point (IEP) detection.

Figure 7:
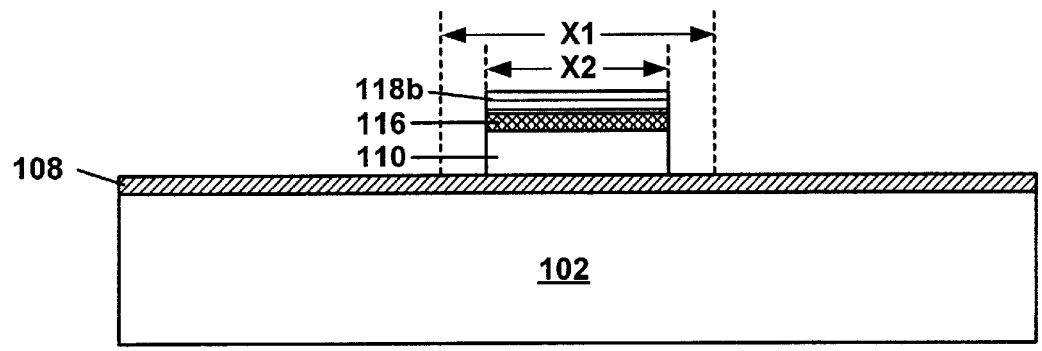
FIG. 7 is a schematic cross-sectional view of a semiconductor wafer following removal of portions of the polysilicon or polysilicon-germanium gate layer, in which the etch stop layer is the high-K dielectric material layer, in accordance with an embodiment of the present invention.

FIG. 7 is a schematic cross-sectional view of the semiconductor wafer following removal of portions of the polysilicon or polysilicon-germanium gate layer 110, at the completion of step S1005-p. As shown in FIG. 7, the gate etching stops at the high-K dielectric material layer 108. As noted, the gate etching does not remove the high-K dielectric material layer. As shown in FIG. 7, the gate layer 110 has the FICD dimension X1 following the gate etch.

As shown in FIG. 10, step S1005 further comprises the step S1005-d, in which the high-K dielectric material is plasma etched.

In one embodiment, the step, S1005-d, plasma etching the high-K dielectric material, comprises providing a mixture of gases comprising oxygen, a fluorine-containing material and an inert gas. In one embodiment, step S1005-d does not use chlorine in the plasma etching, and in one embodiment, step S1005-d does not use HBr in the plasma etching.

In one embodiment, the fluorine containing material is one or more of $CF_4$, $C_2F_6$, $CHF_3$, $C_2HF_5$, $CH_2F_2$, $C_2H_2F4$, and $XeF_2$. Other known fluorine-containing materials may be used.

In one embodiment, the fluorine containing material may be provided at a flow rate from about 1 sccm (cubic centimeters per minute at standard conditions) to about 20 sccm to the plasma chamber. In another embodiment, the fluorine containing material may be provided at a flow rate from about 5 sccm to about 10 sccm to the plasma chamber. As will be recognized, the exact flow of fluorine containing material may be varied based on, for example, the size of the plasma chamber, the concentration of fluorine species desired in the plasma, the particular fluorine containing material selected for use, and other factors.

In one embodiment, in step S1005-d, the inert gas is argon. In another embodiment, the inert gas is one of xenon, neon and helium, or a mixture thereof. In another embodiment, the inert gas is a mixture of argon and one or more of xenon, neon and helium. In one embodiment, the inert gas may be provided at a flow rate in the range from about 50 sccm to about 500 sccm. In another embodiment, the inert gas is provided at a flow rate in the range from about 200 sccm to about 300 sccm. As will be recognized, the exact flow of inert gas may be varied based on, for example, the size of the plasma chamber, the concentration of fluorine species desired in the plasma, the particular fluorine containing material selected for use above, the identity of the inert gas used, and other factors.

In one embodiment, in step S1005-d, the oxygen is provided at a flow rate in the range from about 5 sccm to about 100 sccm. In another embodiment, the oxygen is provided at a flow rate in the range from about 10 sccm to about 50 sccm. As will be recognized, the exact flow of oxygen may be varied based on, for example, the size of the plasma chamber, the concentration of oxygen desired in the plasma, the quantity of polysilicon or polysilicon-germanium to be removed in the plasma etching, and other factors.

FIG. 8 is a schematic cross-sectional view of a semiconductor wafer 100 following plasma etching of a portion of the polysilicon or polysilicon-germanium layer 110 in step S1005-p and plasma etching of a portion of the high-K dielectric material 108 in step S1005-d (and following removal of the resist 118 and the BARC 116). As a result of these steps, the gate stack 114 is formed. As shown in FIG. 8, following the plasma etching steps S1005, the gate stack 114 includes a polysilicon or polysilicon-germanium gate layer 110 and a high-K gate dielectric material layer 108 as parts of the nascent semiconductor device 100.

It is noted that the semiconductor wafer 100 shown in FIG. 8 is "clean", i.e., it is the wafer which is ideally formed by the plasma etching steps. As noted below, the wafer 100 at this stage, following the steps S1005, may in fact have the appearance shown in FIG. 9, i.e, it may include some amount of unwanted residual high-K dielectric material pieces 120. If the wafer appears as in FIG. 9 following the steps S1005, it may be further processed as described below with reference to step S1006.

The plasma etching steps S1005 may be carried out in any suitable commercially available plasma apparatus, at appropriate source and bias power settings. The plasma chamber may be maintained at suitable pressures and temperatures as known in the art. A person of skill in the art can determine appropriate pressures and temperatures, based on the materials to be etched, the etching gases and other relevant factors. The plasma apparatus may be any suitable apparatus known in the art.

The plasma etching steps S1005 may be continued for a suitable period at suitable temperatures, as may be determined by a person of skill in the art. In one embodiment, the plasma etching steps are each carried out for a period ranging from about 5 seconds to about 10 minutes. In another embodiment, the plasma etching steps are each carried out for a period ranging from about 15 seconds to about 5 minutes, and in another embodiment, a period ranging from about 30 seconds to about 3 minutes.

In one embodiment, the plasma etching steps S1005-p and S1005-d are carried out sequentially without moving the wafer from the plasma chamber. In one embodiment, the steps of plasma etching, including both step S1005-p, etching of the polysilicon or polysilicon-germanium layer 110, and step S1005-d, etching the layer comprising a high-K dielectric material 108, are carried out in a single plasma chamber. In one embodiment, the steps of plasma etching are carried out in sequential etching steps, in which the polysilicon or polysilicon-germanium layer 110 is etched by an appropriate chemistry in step S1005-p, and the layer comprising a high-K dielectric material 108 is etched with an appropriate chemistry in step S1005-d, with substantially no movement of the wafer and only minor changes in the plasma conditions other than the changes in plasma chemistry and any associated changes in power settings or material flows, as described above or known to a person of skill in the art. Thus, in the present invention, the steps of etching both the polysilicon or polysilicon-germanium layer 110 and the layer comprising a high-K dielectric material 108 may be integrated into a single etching chamber, in which the wafer need not be moved and only the plasma conditions adjusted between etching steps.

As will be recognized by those of skill in the art, the times and plasma operating parameters may be adjusted as needed, depending on the quantities of polysilicon or polysilicon-germanium and of high-K dielectric material to be removed, the concentration of the gases used in the plasma etching, the identity of the high-K dielectric material to be removed, and other economic and process-related factors.

Following completion of step S1005, the fabrication process of the semiconductor device 100 may be continued, or alternatively, the semiconductor wafer 100 maybe further processed in step S1006, as described in the following disclosure. Both alternative paths are shown in FIG. 10. In one alternative path, the step S1006 follows step S1005. In the other alternative, step S1006 is skipped, and the wafer is further processed without the low power plasma treatment.

Low Power Plasma Removal of Unwanted Residual High-K Dielectric Material

As known in the art, wafers etched in dry conditions, such as plasma etching, are subject to contamination from sources such as residues from the etch process, deposition of non-volatile contaminants from sputtering events associated with the etching process, and from particulate contamination, for example.

Figure 9:
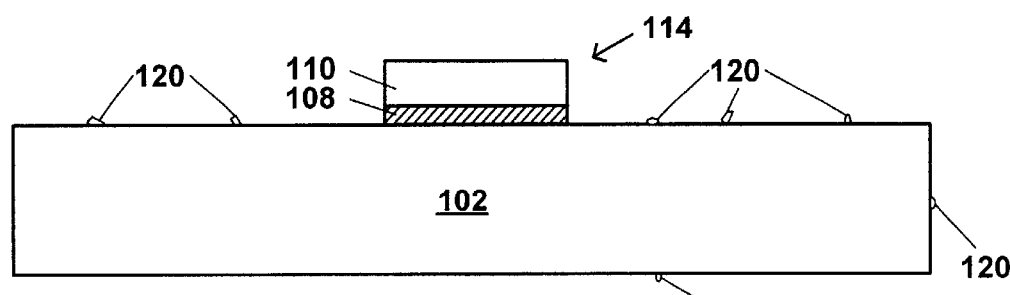
FIG. 9 is a schematic cross-sectional view of a semiconductor wafer following removal of portions of the polysilicon or polysilicon-germanium gate layer and of the gate dielectric layer to form a gate stack, similar to FIG. 8, but in which the etching has left unwanted residual high-K dielectric material.

As shown in FIG. 9, as a result of such contamination in the plasma etching step S1005, one or more pieces 120 of unwanted residual high-K material may remain on the semiconductor wafer 100. The unwanted residual high-K dielectric material pieces 120 may be of any size, from sub-microscopic to macroscopic. The pieces 120 shown in FIG. 9 are exaggerated in size for demonstration purposes, although it is possible the unwanted residual high-K dielectric material may be present in pieces 120 as relatively large as shown in FIG. 9. In general, such pieces 120 are expected to be quite small, i.e., on the order of a few angstroms to a few tens of nanometers, although, as noted even micron-sized or larger pieces occasionally may be present.

It is a purpose of this embodiment of the present invention to provide a process for removing such materials, in order to avoid contamination of downstream apparatus which may be used for both high-K-containing semiconductor wafers and for non-high-K-containing semiconductor wafers. The unwanted residual high-K dielectric material pieces 120 may be on any surface of the semiconductor device 100, in particular the pieces 120 may be on the front, the back or side edges of the semiconductor device 100.

In fabricating semiconductor devices including high-K dielectric materials, it is desirable to be able to integrate the fabricating of such devices into existing production lines, which may also be used for fabricating semiconductor devices not including high-K dielectric materials. While certain specialized apparatus may be required for fabricating the high-K dielectric materials, many of the remaining portions of the semiconductor devices are the same as in devices not including high-K dielectric materials. The devices which are not designed to include high-K dielectric materials need to be protected from contamination with high-K dielectric materials. If the high-K-containing semiconductor wafer shown in FIG. 9, including the unwanted residual high-K dielectric material, is transferred to an apparatus in which non-high-K containing devices are also processed, the non-high-K containing devices may become contaminated with the unwanted residual high-K dielectric material, such as the pieces 120 shown in FIG. 9, if this material is not removed prior to the transfer to such apparatus.

This problem has arisen in the efforts to integrate high-K dielectric materials into semiconductor device fabrication processes. The present invention is intended to address and provide a solution to this problem. The problem does not exist for semiconductor fabrication processes comprising only standard-K dielectric materials. The solution provided by the present invention addresses the problem of removal of unwanted residual high-K dielectric materials when the semiconductor wafer is to be processed in apparatus which handles semiconductor devices sensitive to contamination by high-K dielectric materials.

As shown in Step S1006 of FIG. 10, following plasma etching of the polysilicon or polysilicon-germanium gate layer 110 and the high-K dielectric material layer 108 to form the gate stack 114, the pieces 120 of unwanted residual high-K dielectric material are removed. In accordance with this embodiment of the present invention, the unwanted residual high-K dielectric material 120 is removed by a low power plasma cleaning step, in accordance with the present invention.

A "low power plasma", as used herein, is defined as a plasma having a bias power in the range from about 5 to about 50 watts, and a source power in the range from about 50 to about 1000 watts.

In one embodiment, the low power plasma steps are carried out in the same plasma apparatus as that used for forming the gate stack, described above. The primary difference between the plasma used for forming the gate stack and that used for the low power plasma removal of the unwanted residual high-K dielectric material is in the plasma conditions. For example, in an ICP, the source and bias power are provided to the plasma chamber at levels lower than would be used for plasma etching, as known in the art for similar plasma etching processes. In one embodiment, under low power plasma conditions, source power to the plasma chamber may be maintained in the range from about 50 to about 1000 watts, and in another embodiment, in the range from about 100 to about 500 watts. In one embodiment, the bias power to the plasma chamber may be maintained in the range from about 10 to about 50 watts, and in another embodiment, in the range from about 10 to about 30 watts.

In one embodiment, the low power plasma uses the same etch chemistry used for the high-K plasma etch. In one embodiment, the low power plasma uses the same temperatures used for the high-K plasma etch. In one embodiment, the low power plasma uses both the same etch chemistry and the same temperatures used for the high-K plasma etch. In one embodiment, the only difference in the low power plasma etch is the reduction of power settings. Thus, for example, in one embodiment, the low power plasma comprises application of a plasma comprising oxygen, a fluorine containing gas and an inert gas, as described above for the plasma etching of the high-K dielectric material layer 108.

Application of the low power plasma treatment may be for suitable periods at suitable temperatures, as may be determined by a person of skill in the art. In one embodiment, the step of removing the unwanted residual high-K dielectric material is carried out for a period ranging from about one second to about 10 minutes. In another embodiment, the step of removing the unwanted residual high-K dielectric material is carried out for a period ranging from about 10 seconds to about 3 minutes, and in another embodiment, a period ranging from about 20 seconds to about 1 minute.

As will be recognized by those of skill in the art, the times and plasma operating parameters may be adjusted as needed, depending on the quantity of unwanted residual high-K material to be removed, the particle size of the material to be removed, the concentration of the gases used in the low power plasma treatment solutions, the identity of the high-K dielectric material to be removed, and other economic and process-dictated factors.

As noted above, FIG. 8 is a schematic cross-sectional view of a semiconductor wafer 100 following the steps of the present invention. FIG. 8 shows the semiconductor wafer 100 as it would appear following removal of the pieces 120 of unwanted residual high-K dielectric material, in accordance with one embodiment of the present invention, i.e., at the completion of step S1006. Thus, as suggested by the fact that FIG. 8 is used to show the product of this embodiment, and to show the (ideally clean) product of steps S1005, the semiconductor wafer 100 should be substantially the same following both steps, with the possible exception of some residual high-K material following steps S1005. As shown in FIG. 8, following the low power plasma treatment of the present invention, the pieces 120 of unwanted residual high-K dielectric material have been removed from all surfaces of the semiconductor device 100.

Thus, subsequent apparatus used for processing the high-K-containing wafer and other wafers not containing high-K materials are much less likely to become contaminated with high-K dielectric material, resulting in contamination of wafers subsequently process in the same apparatus. When the high-K-containing wafer is subsequently transferred to an apparatus commonly used, there will be little or no likelihood of contamination from unwanted residual high-K dielectric materials remaining on the first wafer. As a result of the low-power plasma treatment, substantially all of the high-K dielectric material layer is removed from the wafer except for a portion forming the gate dielectric. As a further result of the low-power plasma treatment, the subsequent apparatus remains substantially free of contamination by the residual high-K dielectric material. This allows the high-K material to be safely integrated into existing processes without undue danger of contamination.

Upon completion of formation of the polysilicon or polysilicon-germanium gate electrode 110, the high-K gate dielectric material layer 108, removing the pieces 120 of unwanted residual high-K dielectric material, and further processing, including formation of the source and drain 104, 106, the semiconductor device 100 shown in FIG. 1 is obtained. The source and drain 104, 106 may be formed prior to or subsequent to deposition of the high-K gate dielectric material layer 108 and the polysilicon or polysilicon-germanium gate electrode 110, or subsequent thereto, such as by a self-aligned implantation method. Thereafter, the semiconductor device 100 may be further processed as appropriate to the fabrication scheme of which the process of the present invention is a part, as shown in the final step of FIG. 10.

INDUSTRIAL APPLICABILITY

As a result of the process of the present invention, a polysilicon or polysilicon-germanium gate electrode and a high-K gate dielectric may be formed in a single plasma etch chamber, and without possibly contaminating downstream apparatuses which may be used to process both the high-K dielectric material containing semiconductor wafers and the non-high-K containing semiconductor wafers. Thus, high-K dielectric material containing semiconductor wafers can be fabricated in, i.e., integrated into, the same process lines used for fabrication of non-high-K containing semiconductor wafers, and it is not necessary to include a separate step for removing the portions of the high-K dielectric material layer on the surface of the wafer outside the gate stack. As a result, the high-k dielectric material may be integrated efficiently and without contamination problems which may otherwise occur, and the high-K dielectric material may be integrated into a process also used for fabricating non-high-K-containing semiconductor devices.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A process of fabricating a semiconductor device, comprising:

providing a first semiconductor wafer;

depositing on the first semiconductor wafer a layer comprising a high-K dielectric material layer;

depositing on the layer comprising a high-K dielectric material a polysilicon or polysilicon-germanium layer; and forming a gate stack by plasma etching both a portion of the polysilicon or polysilicon-germanium layer and a portion of the layer comprising a high-K dielectric material, wherein the steps of plasma etching are carried out in a single chamber without moving the first wafer from the chamber and without opening the chamber, and wherein the step of plasma etching the polysilicon or polysilicon-germanium layer comprises providing a HBr/Cl$_2$/HeO$_2$ chemistry to the chamber.

2. The process of claim 1, wherein the step of plasma etching the high-K dielectric material layer comprises providing oxygen, a fluorine-containing material and an inert gas to the chamber.

3. The process of claim 2, wherein the fluorine-containing material is CF$_4$, C$_2$F$_6$, CHF$_3$, C$_2$HF$_5$, CH$_2$F$_2$ or mixtures thereof.

4. The process of claim 2, wherein the inert gas is argon, krypton, xenon or a mixture thereof.

5. The process of claim 1, wherein the step of plasma etching removes substantially all of the high-K dielectric material layer from the wafer except for a portion forming the gate dielectric.

6. The process of claim 1, wherein following the step of plasma etching the process further comprises removing from the first wafer any unwanted residual high-K dielectric material present on the first wafer by applying a low power plasma treatment prior to transferring the first wafer to a subsequent apparatus which is used for processing both the first wafer and a second semiconductor wafer not containing a high-K dielectric material.

7. The process of claim 6, wherein the low power plasma treatment removes any residual high-K dielectric material from internal surfaces of the chamber, thereby post-cleaning and conditioning the chamber.

8. The process of claim 6, wherein the unwanted residual high-K dielectric material is present in microscopic or greater quantities.

9. A process of integrating a high-K dielectric material into a fabrication process for processing both a high-K-containing semiconductor wafer and a non-high-K-containing semiconductor wafer, comprising:

depositing on a semiconductor wafer a layer comprising a high-K dielectric material to form a high-K-containing semiconductor wafer;

depositing on the layer comprising a high-K dielectric material a polysilicon or polysilicon-germanium layer;

plasma etching both a portion of the polysilicon or polysilicon-germanium layer and a portion of the high-K dielectric material layer in a single chamber without moving the first wafer from the chamber and without opening the chamber to form a gate stack comprising a gate and a gate dielectric; and applying a low power plasma treatment to the wafer and to the chamber prior to transferring the wafer to a subsequent apparatus in which a non-high-K-containing semiconductor wafer also is processed, wherein the step of plasma etching the polysilicon or polysilicon-germanium layer comprises providing a HBr/Cl$_2$/HeO$_2$ chemistry to the chamber.

10. The process of claim 9, wherein the step of plasma etching the high-K dielectric material layer comprises providing oxygen, a fluorine-containing material and an inert gas to the chamber.

11. The process of claim 10, wherein the fluorine-containing material is CF$_4$, C$_2$F$_6$, CHF$_3$, C$_2$HF$_5$, CH$_2$F$_2$ or mixtures thereof.

12. The process of claim 10, wherein the inert gas is argon, krypton, xenon or a mixture thereof.

13. The process of claim 9, wherein the step of plasma etching removes substantially all of the high-K dielectric material layer from the wafer except for a portion forming the gate dielectric.

14. The process of claim 9, wherein the unwanted residual high-K dielectric material is present in microscopic or greater quantities.

15. The process of claim 9, further comprising a resist trim step prior to the step of plasma etching.

16. A process of fabricating a semiconductor device, comprising:

providing a first semiconductor wafer;

depositing on the first wafer a layer comprising a high-K dielectric material layer;

depositing on the layer comprising a high-K dielectric material a polysilicon or polysilicon-germanium layer;

plasma etching in a single chamber both a portion of the polysilicon or polysilicon-germanium layer and a portion of the layer comprising a high-K dielectric material to form a gate stack comprising a gate and a gate dielectric, wherein the steps of plasma etching are carried out without moving the first wafer from the chamber and without opening the chamber, and the step of plasma etching the high-K dielectric material layer comprises providing oxygen, a fluorine-containing material and an inert gas to the chamber; and removing from the first wafer any unwanted residual high-K dielectric material present on the first wafer by applying a low power plasma treatment in the chamber, wherein the step of plasma etching the polysilicon or polysilicon-germanium layer comprises providing Aa HBr/Cl$_2$/HeO$_2$ chemistry to the chamber.

17. The process of claim 16, further comprising transferring the first wafer to a subsequent apparatus which is used for processing both the first wafer and a second semiconductor wafer susceptible to contamination by a residual high-K dielectric material, wherein the subsequent apparatus remains substantially free of contamination by the residual high-K dielectric material.

18. The process of claim 16, wherein substantially all of the high-K dielectric material layer is removed from the wafer except for a portion forming the gate dielectric.

* * * * *

UNITED STATES PATENT AND TRADEMARK OFFICE
CERTIFICATE OF CORRECTION

PATENT NO.     : 6,451,647 B1
DATED          : September 17, 2002
INVENTOR(S)    : Yang et al.

It is certified that error appears in the above-identified patent and that said Letters Patent is hereby corrected as shown below:

Column 11,
Line 3, replace "(MER1E)" with -- (MERIE) --

Signed and Sealed this

Twenty-eighth Day of January, 2003

JAMES E. ROGAN
*Director of the United States Patent and Trademark Office*